United States Patent [19]

Kasa

[11] Patent Number: 5,293,088
[45] Date of Patent: Mar. 8, 1994

[54] SENSE AMPLIFIER CIRCUIT

[75] Inventor: Yasushi Kasa, Kawasaki, Japan

[73] Assignee: Fujitsu Limited, Kawasaki, Japan

[21] Appl. No.: 523,507

[22] Filed: May 15, 1990

[30] Foreign Application Priority Data

May 16, 1989 [JP] Japan ................... 1-121927

[51] Int. Cl.⁵ .............................................. G11C 7/00
[52] U.S. Cl. ................................. 307/530; 365/204; 365/189.06
[58] Field of Search ............ 307/530; 365/204, 189.06, 365/189.07, 189.09

[56] References Cited

U.S. PATENT DOCUMENTS

| | | | |
|---|---|---|---|
| 3,789,312 | 1/1974 | Heller et al. | 330/35 |
| 4,399,519 | 8/1983 | Masuda et al. | 365/189.06 |
| 4,535,259 | 8/1985 | Smarandoiu et al. | 307/530 |
| 4,601,014 | 7/1986 | Kitano et al. | 365/189.06 |
| 4,797,857 | 1/1989 | Schreck et al. | 365/226 |
| 4,815,040 | 3/1989 | Matsui et al. | 365/203 |
| 4,896,300 | 1/1990 | Shinagawa et al. | 365/204 |
| 4,939,693 | 7/1990 | Tran | 365/204 |

FOREIGN PATENT DOCUMENTS

| | | |
|---|---|---|
| 0238812 | 9/1987 | European Pat. Off. . |
| 3028754 | 2/1982 | Fed. Rep. of Germany . |
| 3740361 | 6/1988 | Fed. Rep. of Germany . |
| 247310 | 7/1987 | German Democratic Rep. . |
| WO88/09034 | 11/1988 | PCT Int'l Appl. . |

*Primary Examiner*—Edward P. Westin
*Assistant Examiner*—Andrew Sanders
*Attorney, Agent, or Firm*—Armstrong, Westerman, Hattori, McLeland & Naughton

[57] ABSTRACT

A sense amplifier circuit for use in a ROM comprises, an excess charge detecting circuit for producing a detection output when a potential of a bit line exceeds a normal value, and an excess charge discharging circuit which operates in response to said excess charge detecting circuit for discharging a bit line charge and for returning the bit line potential to the normal value.

The excess charge detecting circuit and the excess charge discharge circuit can be realized by a diode connected transistor connected between the bit line and an inverter of the sense amplifier. When the bit line potential is about to exceed the predetermined value, the transistor turns on to prevent the bit line potential from exceeding the predetermined value.

11 Claims, 13 Drawing Sheets

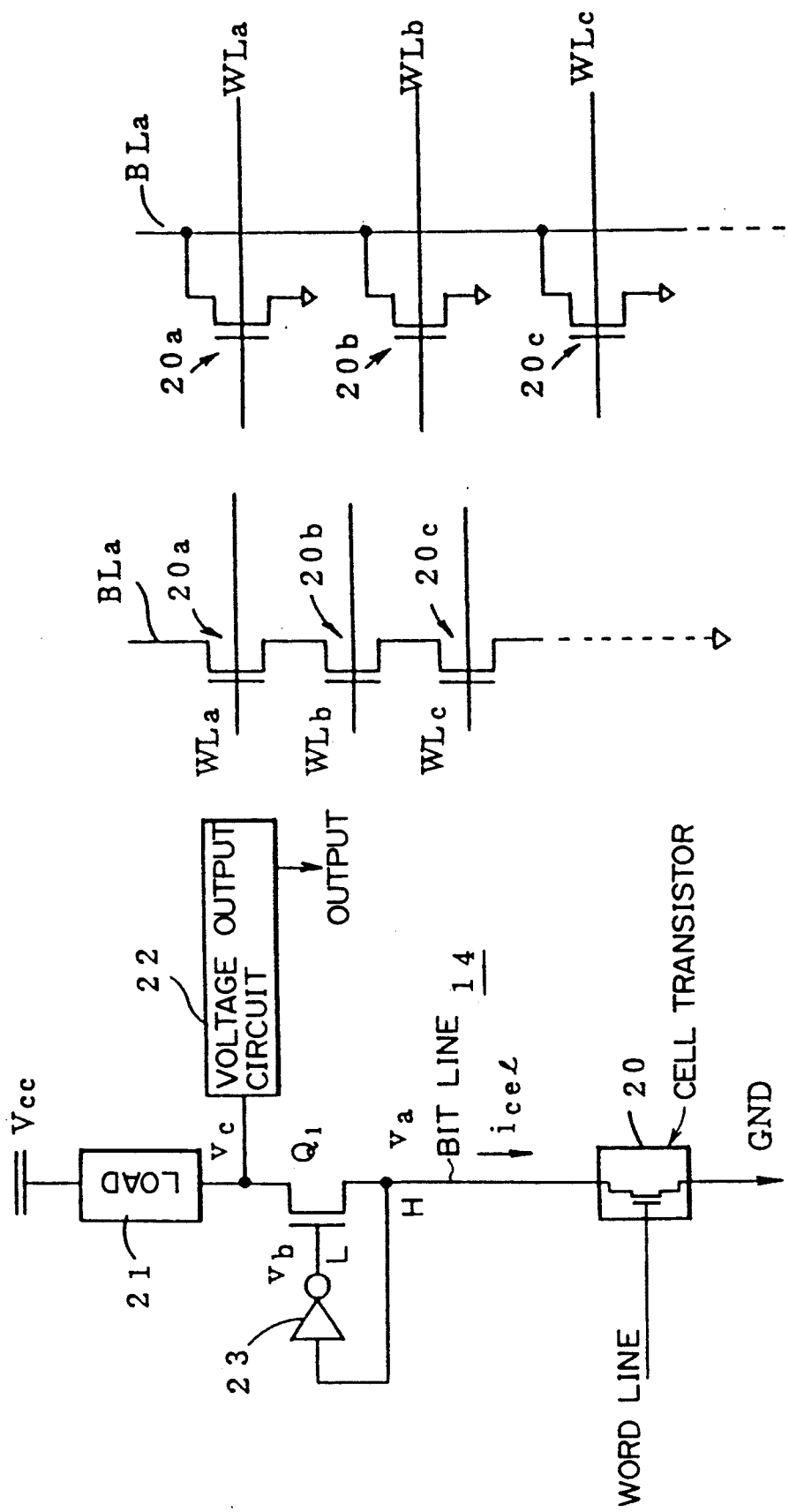

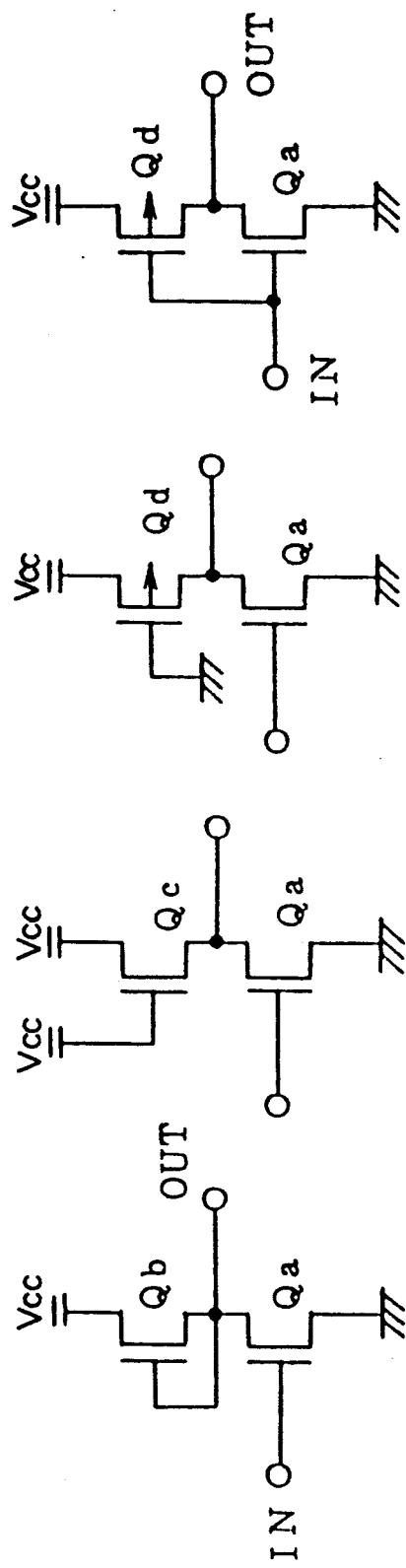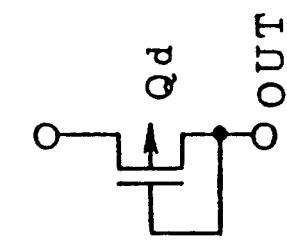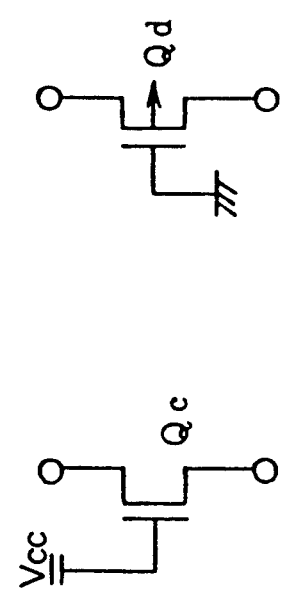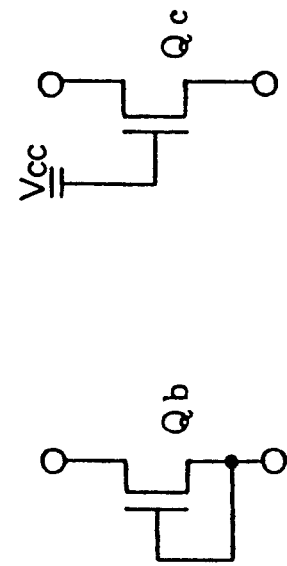
Fig.4A Fig.4B Fig.4C Fig.4D
Fig.4E Fig.4F Fig.4G Fig.4H

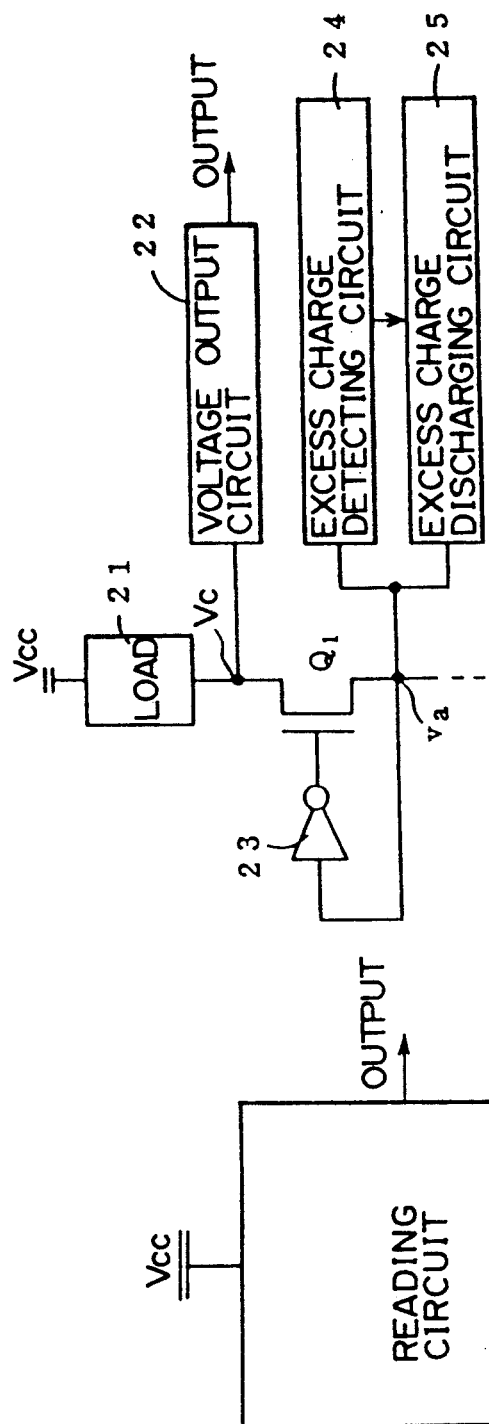
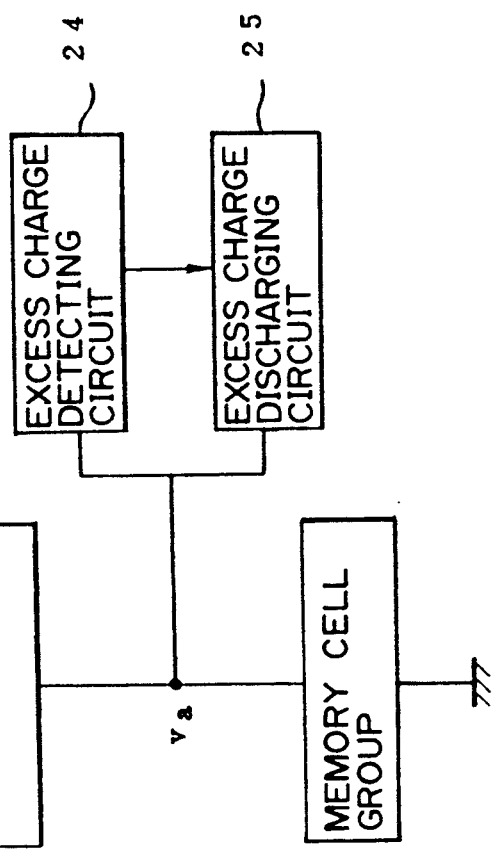
Fig. 11A
Fig. 11B

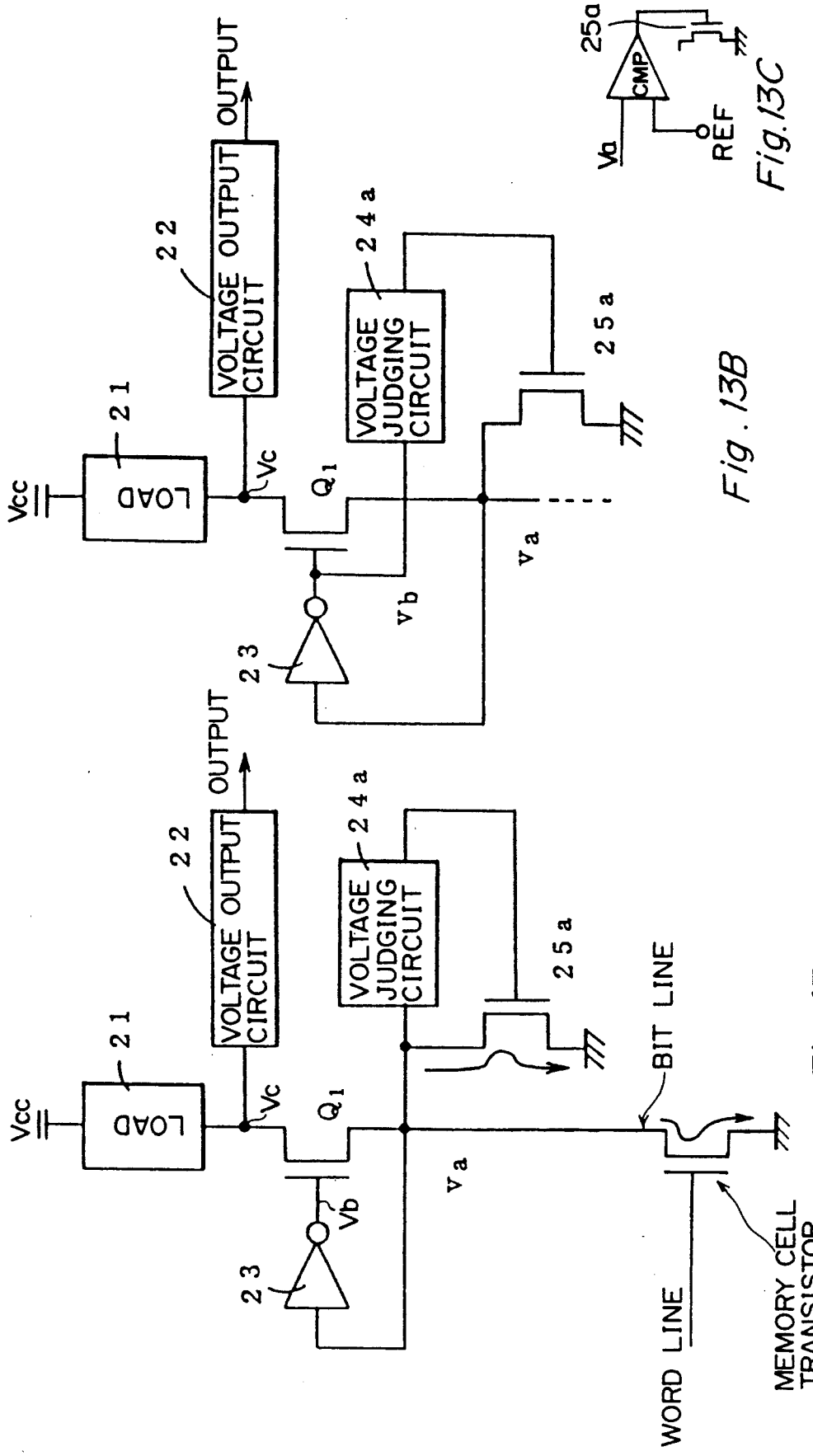

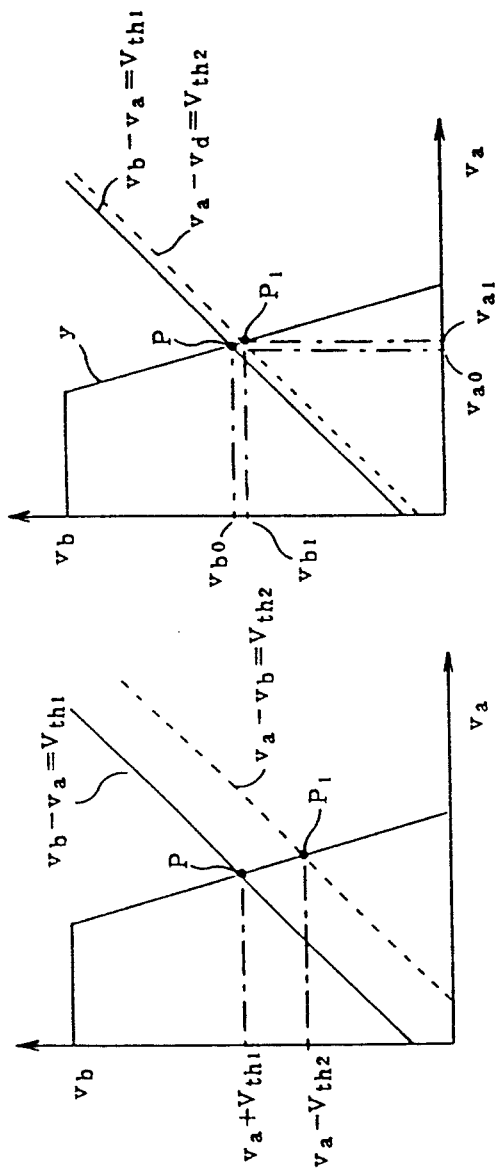
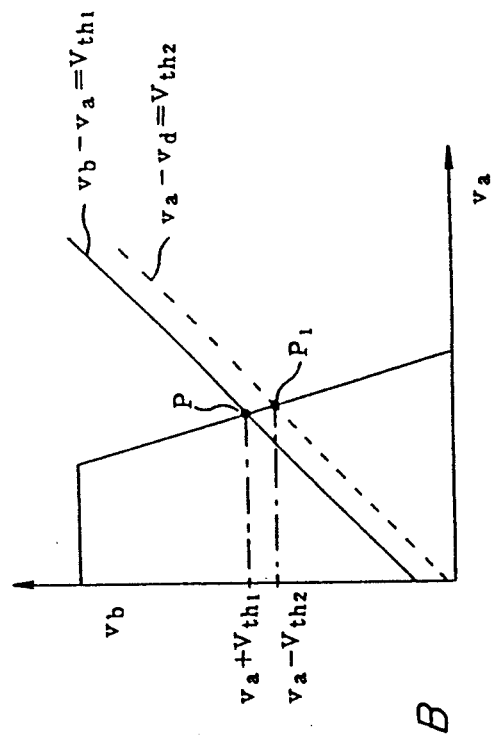
Fig.15A
Fig.15B
Fig.15C

SENSE AMPLIFIER CIRCUIT

BACKGROUND OF THE INVENTION

The present invention relates to a sense amplifier circuit for a reading circuit of a semiconductor memory apparatus, and more particularly to a sense amplifier circuit for a read only memory.

Recent non-volatile memories such as read-only memories (called ROM hereinafter) are required to have large capacity and to operate at high speed. In order to realize a large memory capacity, the memory cell area must be decreased, even if this requires that the current-driving ability of the memory cell transistor be decreased. Thus, it is necessary to develop a sense amplifier which operates at a small cell current.

A ROM is formed as shown in FIG. 1. 10 is a memory cell array comprising a plurality of word lines WL and bit lines BL, and a memory cell 10a provided at respective crossing portions of these word lines WL and bit lines BL. Memory cell 10a comprises, for example, a MOS transistor whose gate is connected to word line WL and whose drain is connected to bit line BL. Memory cell 10a may comprise a bipolar transistor. Word lines WL are selected by row decoder 11 and bit lines BL are selected by column decoder 12, and an address signal is input to these row and column decoders through address buffer 13. The read output of a bit line BL selected by the column decoder 12 is amplified by sense amplifier 14 and is outputted externally through output buffer 15.

That portion designated as sense amplifier 14, comprising a serial connection of load 21, transistor $Q_1$ and memory cell 20, as shown in FIG. 2, is connected between power source $V_{CC}$ and ground GND. A potential at the crossing point of load 21 and transistor $Q_1$ is detected by voltage output circuit 22. The source potential $v_a$ of transistor $Q_1$ is inverted by inverter 23 and applied to a gate of transistor $Q_1$. Memory cell 20 comprises a plurality of memory cells $20a, 20b \ldots$ as shown in FIGS. 3A and 3B. FIG. 3A designates a serial type memory cell and FIG. 3B designates a parallel type memory cell. In a serial type memory, memory cells $20a, 20b \ldots$, which are formed of transistors, store either "1" or "0" depending on whether the transistor is of an enhancement type or of a depletion type. In a parallel type memory, "1" or "0" is stored depending on whether the threshold value is high or low.

In the configuration of FIG. 3A, the non-selection word line is made to level H and the selection word line is made to level L. When the word line WLb is selected, other word lines WLa, WLc, . . . are at H level and transistors $20a, 20c \ldots$ are on regardless of whether the stored value is "1" or "0". Only transistor $20b$, belonging to the selected word line, is turned on and off, depending on whether 1 or 0 is stored. If transistor $20b$ is of the depletion type it is on and if it is of the enhancement type it is off. Accordingly, depending on whether memory cell $20b$ is of the depletion type or the enhancement type, the data stored in memory cell $20b$ is determined to be 1 or 0, and thus a current flows or does not flow in bit line BLa. The potential $V_C$ at the connecting point between load 21 and transistor $Q_1$ in FIG. 2 changes depending on whether or not the bit line current $(i_{cel})$ flows and voltage output circuit 22 detects potential $V_C$ and produces read out data.

In the configuration of FIG. 3B, the selected word line is at H level and the non-selected word line is at L level. Accordingly, memory cells belonging to non-selected word lines are turned off regardless of whether "1" or "0" is stored, and only the memory cell belonging to the selected word line is turned on or off depending on whether "1" or "0" is stored. A current flows or does not flow in bit line BLa, depending on whether the memory cell is turned on or off, thereby changing the voltage $V_C$. Voltage output circuit 22 then detects the voltage $V_C$ and produces the read-out data. Voltage output circuit 22 basically comprises only a line, but may be formed of a circuit for driving an output side circuit to be connected to the sense amplifier.

A column selection gate, which is turned on or off depending on the output of decoder 12, is provided between transistor $Q_1$ and the bit line (cell group).

By making the slope of the input-output characteristic abrupt when inverter 23 in a transient state, the variation of the bit line voltage $v_a$ is suppressed, whether the bit line current $I_{CEL}$ is turned on or off. As shown in FIG. 5, when the cell is on, i.e., when the bit-line current flows, the voltage $v_a$ decreases, but the output $v_b$ of inverter 23 increases. When the cell is off, the voltage $V_a$ increases but the output $V_b$ of inverter 23 decreases quickly, thus decreasing the width of the variation of the voltage $v_a$. This is effective for high speed operation. The voltage $V_C$ is equal to $V_{CC}$-$Rx_{icel}$ under the condition that the resistance of load 21 is R and changes as shown in the drawing, depending on whether the cell is switched on or off.

Various kinds of inverters 23 are shown in FIGS. 4A to 4H. FIG. 4A shows an E-D type, FIG. 4B an E—E type, FIG. 4C and FIG. 4D CMOS types in which Qa is an n-channel enhancement type MOS transistor, Qb is an n-channel depletion type MOS transistor and Qd is a p-channel type MOS transistor. FIGS. 4E to 4H show only load portions. The gate of p-channel type transistor Qd is connected to ground in FIGS. 4C and 4G, connected to input IN in FIG. 4D and connected to the drain (output OUT) in FIG. 4H. The input-output characteristic of inverter 23 is shown in FIG. 6. When the input voltage $v_a$ is L (low), the output voltage $v_b$ is H (high), and when the input voltage $v_a$ is H (high), the output voltage $v_b$ is L (low). The input and the output characteristic changes proportionally between the above two states, as shown in FIG. 6. The variation width $\Delta v_a$ of the voltage $v_a$ in FIG. 6 is obtained from this proportionate area. Thus, the variation $\Delta v_b$, which is expanded from the variation width $\Delta v_a$, can be obtained. The boundary at which the transistor $Q_1$ is turned on/off, is determined from $v_b - v_a = V_{th1}$, assuming that $V_{th1}$ is the threshold voltage of the transistor. P1 is a balance point at which the cell is turned off and P2 is the balance point when the cell is tuned on. The variation of voltage $v_a$ is small, as shown in FIG. 6.

For multi-value logic, the current is divided into several steps and for binary-value logic, the two states, i.e., the state in which current flows and the state in which current does not flow, are provided. Let us explain the example of two steps in which the current flows or does not flow.

As described above, the output of inverter 23 is fed back to the input of inverter 23 through transistor $Q_1$. Moreover, the input-output characteristic of the inverter is abrupt. Therefore, the range of variation of $v_a$ can be made small, and $v_b$ can be changed quickly. That is, the variation of $V_a$ is made small so that the existence of a bit line capacitance shown in FIG. 7 does not greatly affect the operation of the cell 20, and the range of the variation in $v_b$ is made large, thus enabling the on/off control of transistor $Q_1$ to be conducted at high speed and with certainty. When the memory cell is changed from a state in which current flows to a state in which current does not flow, the current stops flowing when $v_b - v_a$ is equal to the $V_{th}$ of $Q_1$ (at point P1). When a current flows in the memory cell, a charging operation of the bit line capacitance 24 is conducted and then completed. Thus, a current flowing through the bit line capacitance of the bit line is made 0. Thus, $v_b - v_a$ changes until the current flowing into transistor $Q_1$ becomes equal to the cell current (P2).

A column selection gate shown in FIG. 7 is connected between a cell 20 and a sense amplifier comprising transistor $Q_1$, inverter 23 and load 21 and has a relatively large capacitance. As shown in FIG. 8, a parasitic capacitance $C_{WB}$ exists between bit line BL and word line WL. $C_{BL}$ is a parasitic capacitance existing between bit line BL and ground. The bit line potential is almost equal to $v_a$. Thus, a change in $v_a$ means that the bit line potential changes and that the charges stored in bit line capacitances $C_{BL}$ and $C_{WB}$ change accordingly. When a current flows in the cell 20, the cell 20 has caused a discharge current of the bit line capacitance to flow, in addition to a sense current. The current flowing in the cell 20 and the sensed current differ in accordance with the amount of the discharge current. This is a factor contributing to access delay.

The fact that the change in $v_a$ is small means that the change in bit line potential is small and thus that the change in charge stored in the bit line is small, thereby decreasing the delay in access speed caused by the discharge current and providing an advantage of increased operation speed.

However, when the bit line potential exceeds that required for normal operation, the sense amplifier operates only after the excess charge is discharged by the cell transistor.

The reason for the above operation is that a variation in word line potential is reflected on a bit line by a parasitic capacitance $C_{WB}$ between a word line and a bit line and that an operation point of a sense amplifier varies in accordance with a power source potential variation caused by a noise.

Excess charge-up due to the power source voltage variation is explained by referring to FIGS. 9 and 10. The power source voltage is changed from an ordinary state (state A in FIG. 9) of a cell off-state at the power source voltage $V_{CC}$ to a state at power source voltage $V_{CC} + \Delta V$. The input voltage $v_a$ of inverter 23 is detected under a new power source voltage $V_{cc} + \Delta V$ as if it would apparently decrease, thereby increasing $v_b$ (state B in FIG. 9, a→b in FIG. 10). As a result, current flows through transistor $Q_1$ and the bit line capacitance is charged up. As a result, $v_a$ increases and $v_b$ decreases, thereby providing a new stable state under the voltage $V_{CC} + \Delta V$ (state C, b→c). When the source voltage is returned from this state to $V_{CC}$, it is detected as if $v_a$ had increased and $v_b$ had decreased (state D, c→d). However, even if $v_b$ decreases by a large amount, transistor $Q_1$ only turns off at a voltage of less than $v_b - v_a = V_{th1}$ and the current supply is cut off. Therefore, $v_a$ maintains the present potential by means of a bit line capacitance (as shown by a dashed line in state E, d). When the state of the cell changes from OFF to ON as a result of an address selection by an addres signal ADDRESS, the excess charge is discharged through a cell transistor.

The potential of $v_a$ decreases and the potential of $v_b$ increases (as shown by a dashed line in state F′, d→a). After excess charge is discharged, until $v_b - v_a > V_{th1}$, an ordinary sense operation is carried out (state G, a→e). In the conventional current driving capability of a cell transistor, a time delay or a surplus time period shown in a state F′ and d→a time delay is relatively unimportant, but when the current driving capability of the cell, i.e., the current driving capability by which the input-output characteristic is driven from d to e, becomes weak because of a fine pattern of the cell, the time delay in this surplus time period F′ becomes large, greatly affecting access time.

SUMMARY OF THE INVENTION

An object of the present invention is to make improvements regarding the above points and, by preventing excess charge-up of bit line capacitance, to realize a sense amplifier with high speed operation.

A feature of the present invention resides in a sense amplifier circuit for use in a non-volatile memory comprising, an excess charge detecting circuit for producing a detection output when the potential of a bit line exceeds a normal value, an excess charge discharging circuit which operates in response to said excess charge detecting circuit for discharging a bit line charge and for returning the bit line potential to the normal value.

The aforementioned and other objects of the present invention are accomplished by providing a sense amplifier circuit having the following structural arrangements:

A sense amplifier circuit for use in a non-volatile memory comprising:

excess charge detecting means for detecting an excess charge on a bit line of said non-volatile memory and producing a detection output when a potential of said bit line exceeds a predetermined value, the excess charge detecting means comprising a comparator for detecting the excess charge based on a reference voltage supplied to the comparator; and excess charge discharging means for discharging the excess charge on the bit line to return the bit line potential to the predetermined value in response to the detection output.

A sense amplifier circuit for use in a non-volatile memory having a plurality of memory cells connected to at least one bit line, comprising:

amplifier means comprising a load, a transistor connected between the load and the bit line, and an inverter connected between the bit line and a gate of the transistor, wherein the amplifier means senses data from the bit line; and excess charge detecting means for detecting an excess charge in the amplifier means and for discharging the excess charge, the excess charge detecting means being responsive to an output of the inverter.

A sense amplifier circuit for use in a non-volatile memory with a plurality of memory cells connected to at least one bit line, comprising:

amplifier means comprising a load, a transistor connected between the load and the bit line, and an inverter connected between the bit line and a gate of the transistor, wherein the amplifier means senses data from the bit line; and excess charge detecting means for detecting an excess charge of the amplifier means and for discharging the excess charge, the excess charge detecting means being responsive to a potential of the bit line and an output of the inverter.

The just-mentioned sense amplifier circuit includes the excess charge detecting means which comprises:

a first n-channel transistor having a first terminal connected to a power source and having a gate connected to the output of the inverter for decreasing the output of the inverter;

a second n-channel transistor having a diode connection and having a first terminal connected to a second terminal of the first n-channel transistor for decreasing an output voltage of the first n-channel transistor by a first threshold voltage; and a p-channel transistor having a first terminal connected to the bit line and having a second terminal connected to ground for increasing a voltage of the bit line by a second threshold voltage, and for increasing an output of the second n-channel transistor by the second threshold voltage;

wherein excess charge on the bit line discharges through the p-channel transistor when the excess charge exceeds a predetermined value.

A sense amplifier circuit for use in a non-volatile memory having a cell connected to a bit line and a word line comprising:

sensing means for sensing a current flowing in the bit line in response to an operation state of the cell; and preventing means operatively coupled to the sensing means and to the bit line for preventing a voltage of the bit line from exceeding a predetermined value, wherein the preventing means comprises:

means, including an inverter, for causing a current to flow from the bit line to the sensing means when the bit line voltage exceeds a predetermined value, wherein at least one of an input and an output of the inverter is connected to the sensing means.

A sense amplifier circuit for use in a non-volatile memory having a memory cell connected to a bit line and a word line, comprising:

sensing means for sensing a current flowing in the bit line in response to an operation state of the memory cell;

preventing means operatively coupled to the bit line for preventing a voltage of the bit line from exceeding a predetermined voltage, wherein the preventing means comprises:

means for decreasing a voltage obtained from the sensing means by a first predetermined value;

means for increasing the output of the decreasing means by a second predetermined value; and means for discharging a current when the bit line voltage exceeds said predetermined voltage.

A sense amplifier circuit for use in a non-volatile memory having a memory cell connected to a bit line and a word line, comprising:

sensing means for sensing a current flowing in the bit line in response to an operation state of the memory cell;

preventing means operatively coupled to the bit line for preventing a voltage of the bit line from exceeding a predetermined voltage, wherein the preventing means comprises:

a first n-channel transistor for decreasing a voltage obtained from the sensing means by a first predetermined value;

a second n-channel transistor for decreasing an output value of the first n-channel transistor by a second predetermined value; and a p-channel transistor for increasing an output of the second n-channel transistor by a third predetermined value.

A sense amplifier circuit for use in a non-volatile memory having a memory cell connected between a bit line and a word line, comprising:

load means having a first terminal connected to a power source;

a sensing transistor having a first terminal connected to a second terminal of said load, the sensing transistor having a second terminal connected to the bit line for sensing a current flowing through the memory cell;

inverter means connected to the bit line for inverting a bit line voltage to apply an inverted voltage to a gate of the sensing transistor means; and a diode connected transistor having a drain connected to the bit line for preventing the bit line voltage from exceeding a predetermined value, the diode connected transistor turning on when the bit voltage is about to exceed the predetermined value.

BRIEF DESCRIPTION OF THE DRAWINGS

FIG. 2 shows an explanatory view of a sense amplifier circuit,

FIG. 3A and 3B show explanatory views of a memory cell array,

FIG. 4A to 4H show diagrams of circuits of various inverters,

FIGS. 11A to 11D show views for explaining the principle of the present invention, FIGS. 13A and 13B and FIGS. 14A to 14E show circuits of various embodiments according to the present invention, and FIG. 13C shows a comparator, FIGS. 15A to 15C show explanatory views of an operation of the embodiments shown in FIGS. 14A to 14E.

PREFERRED EMBODIMENTS

As shown in FIG. 11A, the present invention provides a circuit 24 for detecting an excess charge up of a bit line and an excess charge discharging circuit 25 to be operated by the output of detecting circuit 24.

Figure 11C:
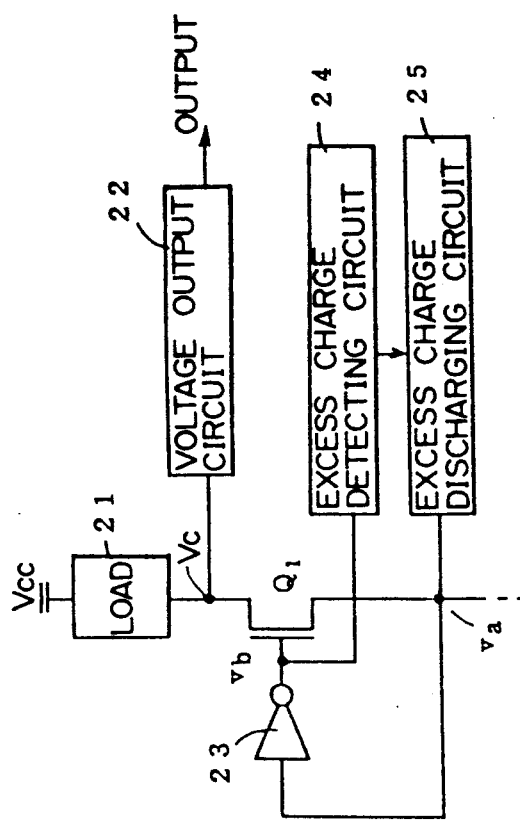
Figure 11D:
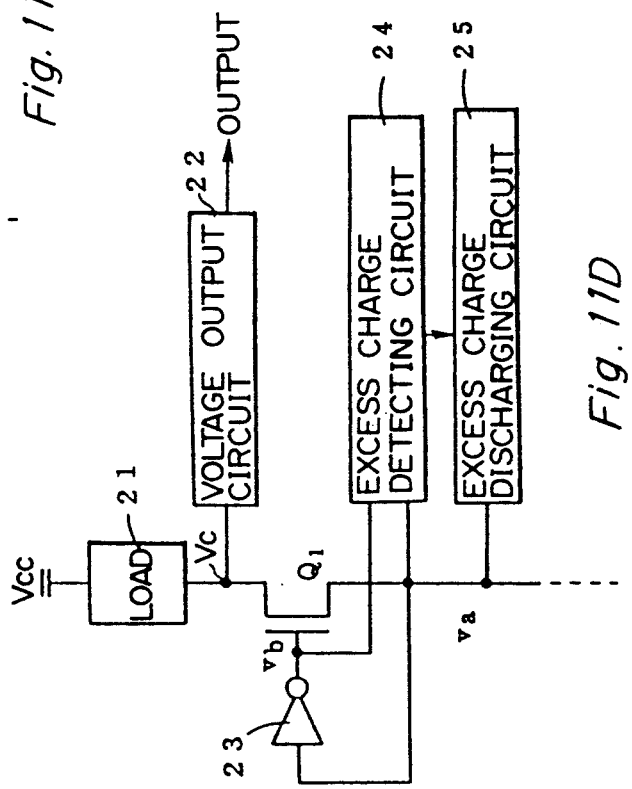

An excess charge up can be detected as an increase in potential. As shown in FIGS. 11A and 11B, excess charge detecting circuit 24 receives a bit line potential $v_a$ and detects the excess charge up. As shown in FIG. 11C, excess charge detecting circuit 24 receives the output voltage $v_b$ (a gate voltage of transistor $Q_1$) from inverter 23 and, as shown in FIG. 11D, receives both voltages $v_a$ and $v_b$.

In this arrangement, when the excess charge of the bit line is detected by excess charge detecting circuit 24, excess charge discharging circuit 25 operates to discharge the excess bit line charge. Thus, the bit line potential decreases, deviating from the excess charge up state, and discharging circuit 25 stops the operation.

Figure 1:
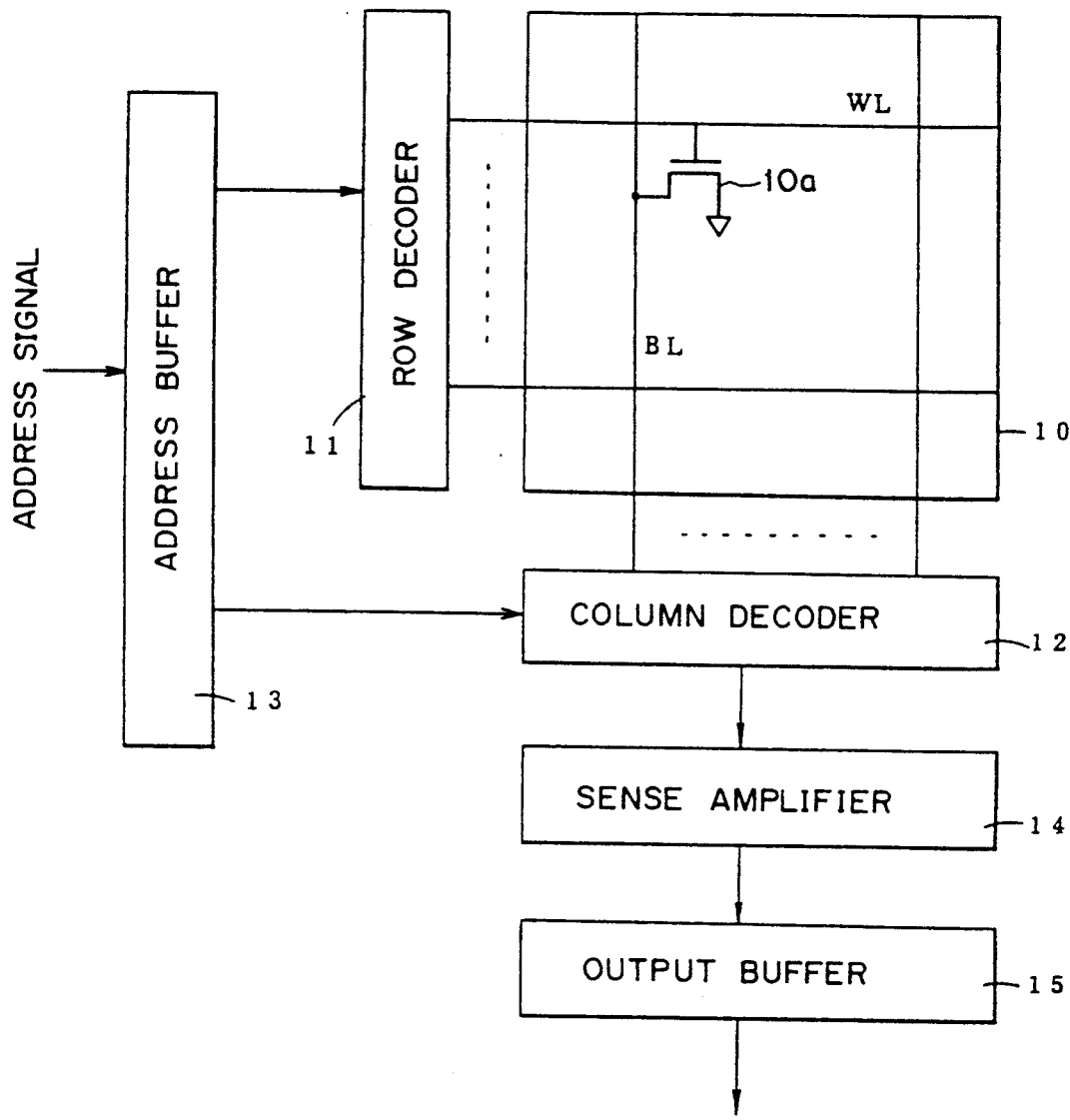
FIG. 1 shows a block diagram of a read only memory.
Figure 6:
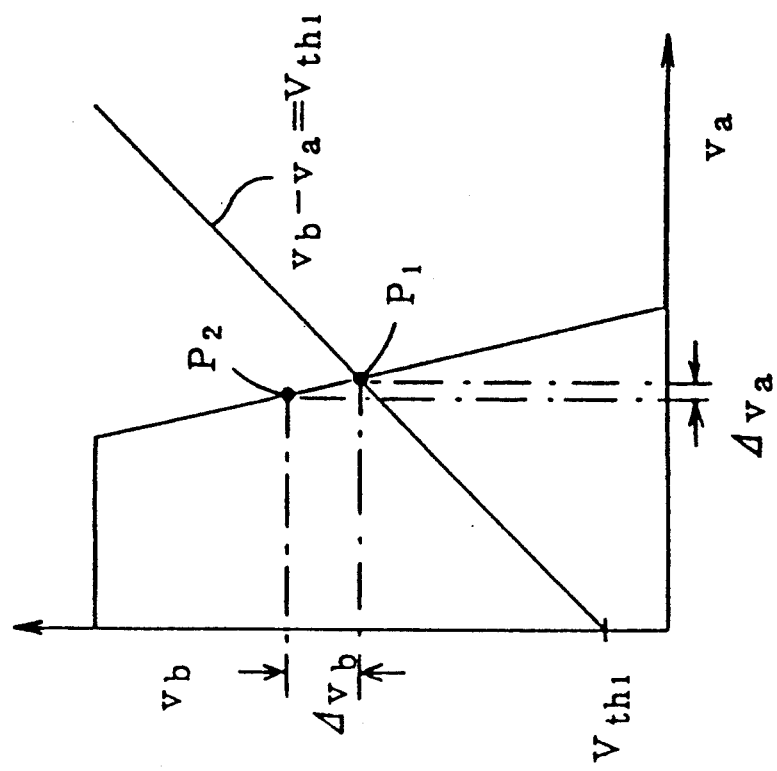
FIG. 6 shows an explanatory view of another operation of a sense amplifier.
Figure 5:
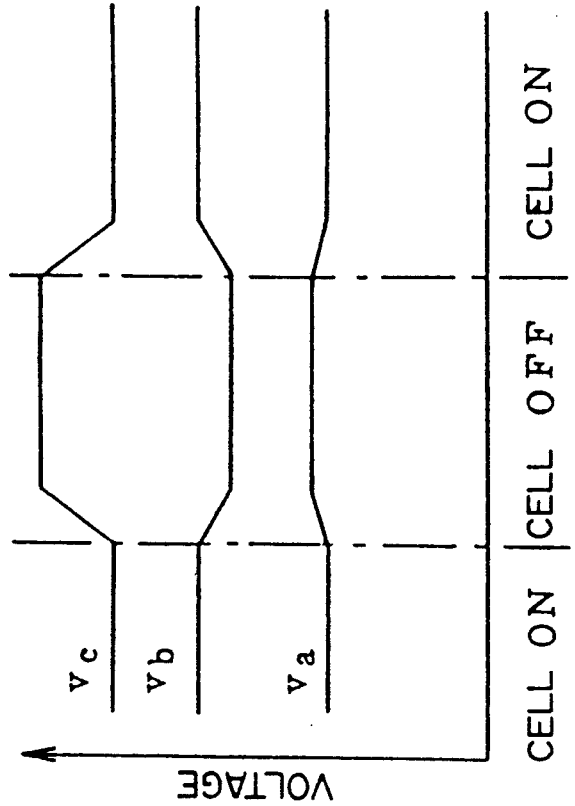
FIG. 5 shows an explanatory view of an operation of a sense amplifier.
Figure 7:
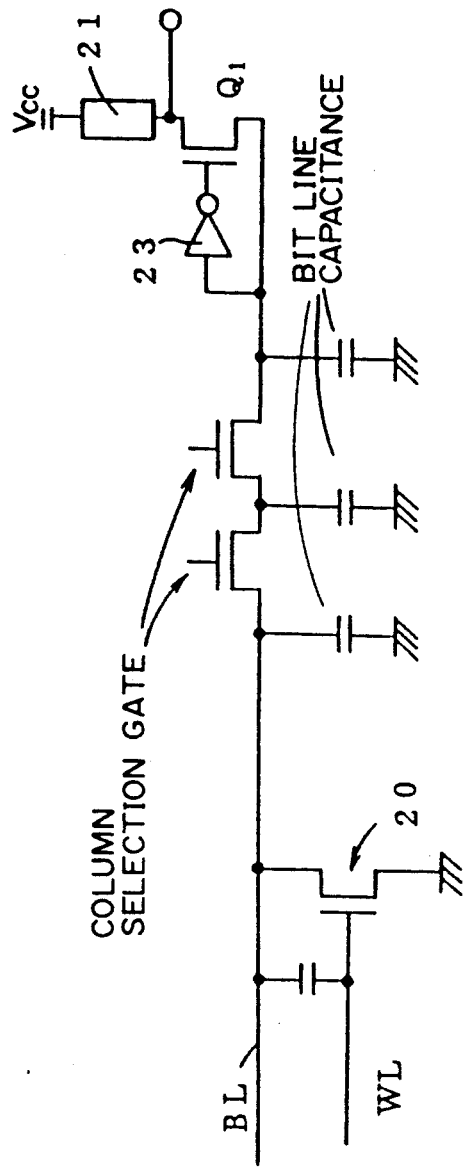
FIG. 7 shows an explanatory view of a bit line parasitic capacitance.
Figure 8:
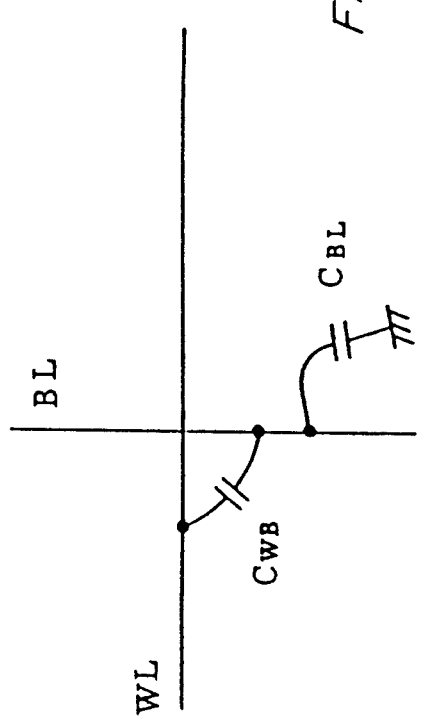
FIG. 8 is a view for a explaining the capacitance between a word line and a bit line.
Figure 9:
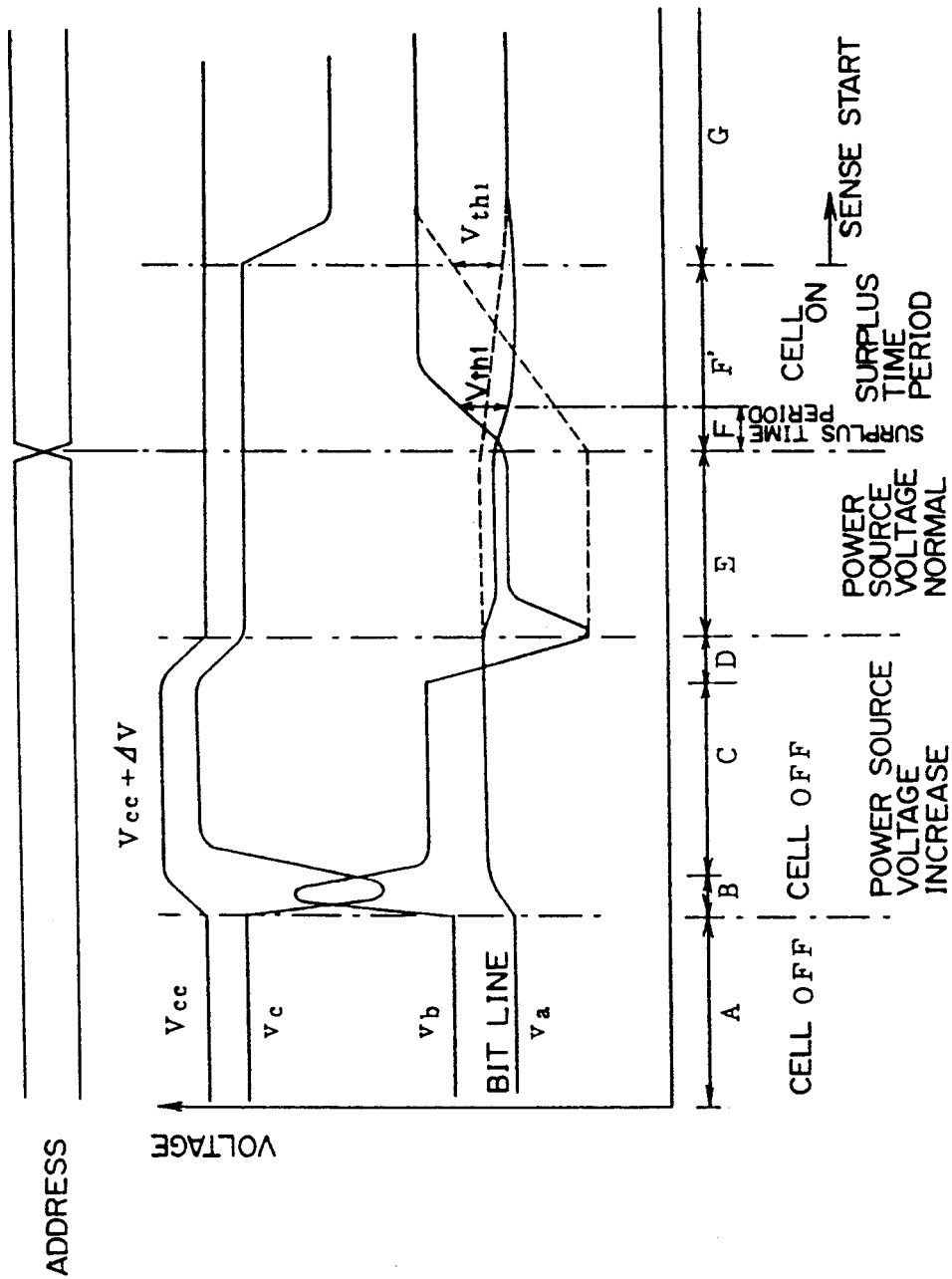
FIG. 9 is a view for explaining the operation where a power source voltage variation occurs by comparing a prior art device with the present invention.
Figure 10:
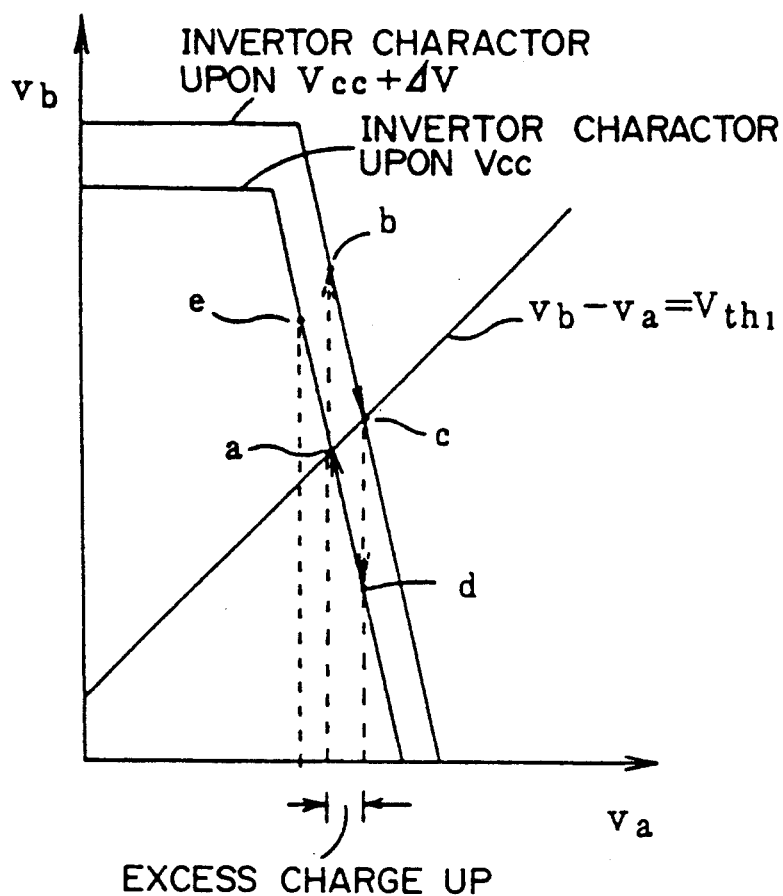
FIG. 10 is a view for a explaining the operation where a power source voltage variation occurs.

Therefore, the operation returns from d to a in FIG. 10 and upon cell ON, a immediately moves to e, thereby starting a sensing operation. Thus, d is made close to e and a high speed operation is possible, by eliminating state F' shown in FIG. 9. In state E of FIG. 9, because of the discharge of the excess bit line charge by excess charge discharging circuit 25, $V_a$ decreases and thus $V_b$ greatly increases, thereby decreasing the difference between $V_a$ and $V_b$, as shown by the solid line. Thus, in the present invention, surplus time period F is greatly shortened as compared with the prior art surplus time period F'.

Figure 12:
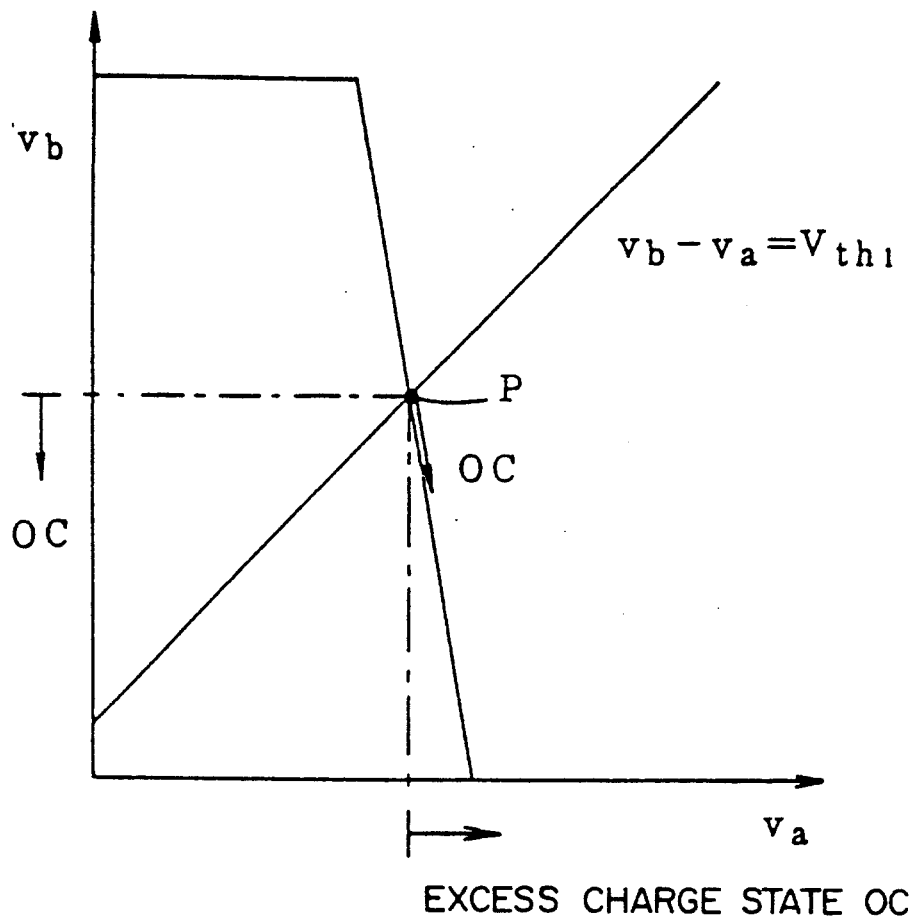
FIG. 12 shows an explanatory view of an excess charge state.

The crossing point P between a straight line of $v_b - v_a = V_{th1}$, and the input-output characteristic of the inverter is an ordinary point for the cell OFF, as shown in FIG. 12. Ranges in which $v_a$ is higher than this point P and in which $v_b$ is lower than this point P are considered to be within the excess charge state OC. The excess charge detecting circuit of FIGS. 11A, 11B and 11C detects an abnormality of $v_a$, $v_b$, and $v_b - v_a$.

An embodiment of the present invention is shown in FIGS. 13A to 14D. The same parts are designated by the same reference numbers throughout all the drawings.

In FIG. 13A, excess charge detecting circuit 24 comprises voltage judging circuit 24a for judging the voltage $v_a$ and excess charge discharging circuit 25 comprises a transistor 25a connected between the bit line and ground. An inverter shown in FIG. 4A to 4H or comparator CMP shown in FIG. 13C can be used for voltage judging circuit 24a. The inverter detects an excess charge based on whether or not the voltage $v_a$ exceeds a threshold value and the comparator detects the excess charge based on whether or not the voltage $v_a$ exceeds a reference voltage REF. When the bit line voltage $v_a$ exceeds the threshold value or the reference voltage, the output of voltage judging circuit 24a becomes H level and transistor 25a is turned ON, thereby discharging the bit line charge. When the bit line voltage $v_a$ is decreased by this discharge operation, the output of voltage judging circuit 24a becomes L and transistor 25a is turned OFF, thereby stopping the discharge.

In FIG. 13B, voltage judging circuit 24a observes the output of the inverter and transistor 25a turns ON when the inverter output $v_b$ decreases and becomes less than the threshold value or the reference voltage.

Figure 14A:
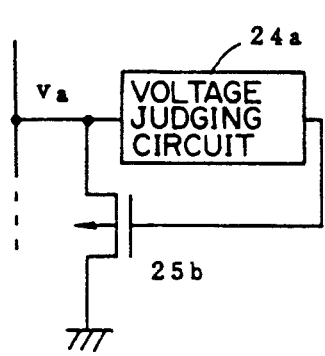
Figure 14B:
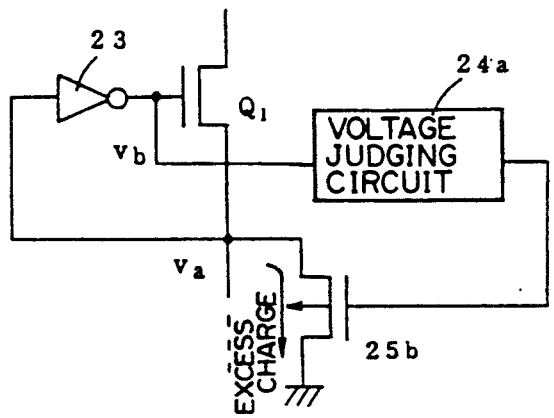

FIGS. 14A and 14B are similar to FIGS. 13A and 13B. In FIGS. 13A and 13B, n-channel transistor 25a is used but in FIGS. 14A and 14B, p-channel transistor 25b is used. Except for this feature, FIGS. 14A and 14B are the same as FIGS. 13A and 13B.

Figure 14C:
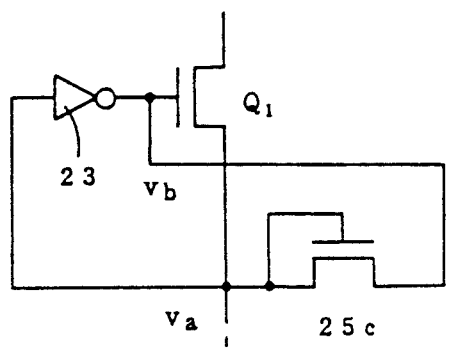

In FIG. 14C, excess charge detecting circuit 24 and excess charge discharging circuit 25 are formed of a single transistor 25c. This transistor 25c is diode connected and the threshold value is determined as $V_{th2}$. Then when $v_a - v_b \geq V_{th2}$, transistor 25c turns ON, thereby discharging the charge. Thus, the value of $V_a - V_b$ is corrected to be equal to $V_{th2}$ so that $V_a - V_b = V_{th2}$. This state is shown in FIG. 15A. Although the correction is lacking by P1−P as compared with a normal state, the circuit is made simple.

Figure 14D:
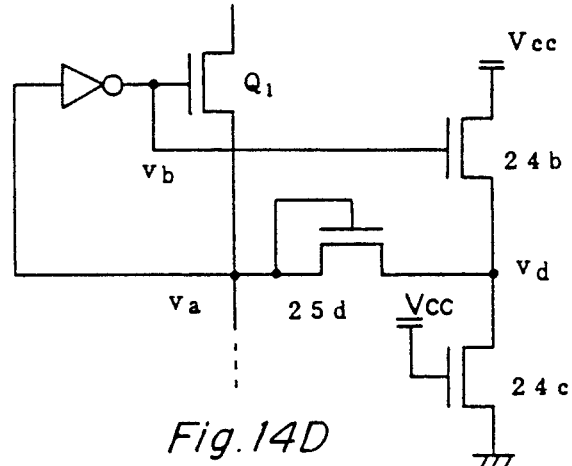

In FIG. 14D, excess charge detecting circuit 24 and excess charge discharging circuit 25 are formed of n-channel transistor 24b, 24c and 25d. The voltage at the serial connecting point between transistors 24b and 24c is determined as $V_d$. When $v_a - v_d \geq V_{th2}$, transistor 25d turns ON and transistor 25c is normally ON, thereby discharging the excess bit-line charge. The discharge is performed until the condition that $v_a - v_d = V_{th2}$ is established. This is shown in FIG. 15B. $V_d$ is smaller than $v_b$ by the threshold value $V_{th3}$ of transistor 24b and thus, point P1 is made closer to point P than in FIG. 14C.

Figure 14E:
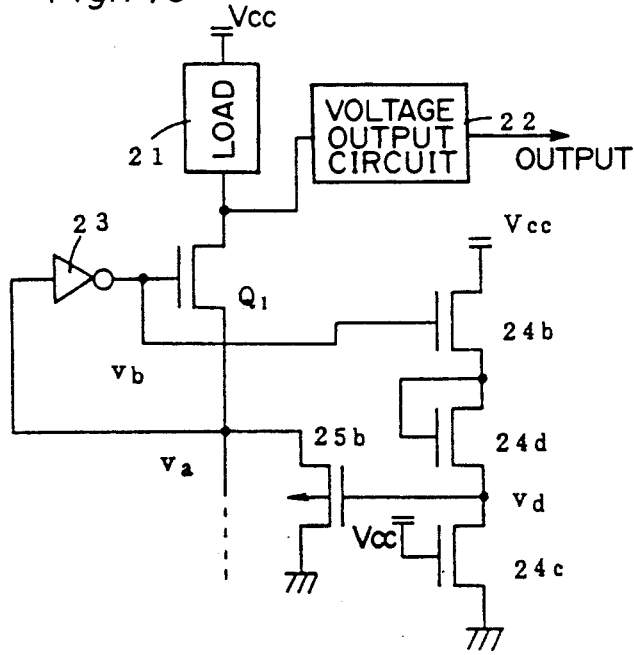

In FIG. 14E, excess charge detecting circuit 24 is formed of n-channel MOS transistors 24b, 24d and 24c and excess charge discharging circuit 25 is formed of p-channel transistor 25b. In this circuit, when transistor 25b is determined to have threshold value $v_{th2}$, and then $v_a - v_d \leq V_{th2}$, transistor 25b turns ON, thereby discharging the bit-line excess charge. When the threshold value of transistors 24b and 24d $V_{th3} - V_{th4}$, the point P1 can be made even closer to the point P, as shown in FIG. 15C. When the relationship $v_b = -Av_a + B$ is established between $v_a$ and $v_b$, the following equations can be provided.

$$V_{b0} = -AV_{a0} + B$$

$$V_{b1} = -AV_{a1} + B$$

$$V_{b0} = V_{a0} + V_{th1}$$

$$V_{b1} = V_{a1} + V_{th3} + V_{th4} - V_{th2}$$

where A is the slope of characteristic Y of a linear portion of the inverter and B is a constant. When it is determined that $V_{th1} = V_{thN}$, and $V_{th3} + V_{th4} - V_{th2} = V_{thp}$, the above equations are re-arranged as follows.

$$v_{b0} - v_{b1} = v_{a0} - v_{a1} + V_{thN} - V_{thp}$$
$$= A(v_{a1} - v_{a0})$$

Therefore, the following relationship is established.

$$V_{a1} - V_{a0} = (V_{thN} - V_{thp})/(1+A)$$

$$V_{b0} - V_{b1} = A(V_{thN} - V_{thp})/(1+A) \approx V_{thN} - V_{thp}$$

When $VthN \approx Vthp$, (generally speaking, the difference is about 100 mV), $Va1 \approx Vao$ and $Vpo \approx Vp1$.

As explained above, the present invention can prevent the bit line potential from being charged up to more than the predetermined value and can decrease the sense time delay caused by an excess charge-discharge and further can sense the data at high speed even for a cell with a weak current driving capability, thereby contributing to the high density of the integration.

What is claimed is:
1. A sense amplifier circuit for use in a non-volatile memory comprising:
   excess charge detecting means for detecting an excess charge on a bit line of said non-volatile memory and producing a detection output when a potential of said bit line exceeds a predetermined value, said excess charge detecting means comprising a comparator for detecting the excess charge based on a reference voltage supplied to said comparator; and
   excess charge discharging means for discharging said excess charge on said bit line to return the bit line potential to the predetermined value in response to said detection output.

2. A sense amplifier circuit for use in a non-volatile memory having a plurality of memory cells connected to at least one bit line, comprising:
amplifier means comprising a load, a transistor connected between said load and said bit line, and an inverter connected between said bit line and a gate of said transistor, wherein said amplifier means senses data from said bit line; and
excess charge detecting means for detecting an excess charge in said amplifier means and for discharging the excess charge, said excess charge detecting means being responsive to an output of said inverter.

3. The sense amplifier circuit according to claim 2, wherein said excess charge detecting means comprises a voltage judgement circuit connected to the bit line, and a transistor having a drain connected to the bit line and having a gate connected to the output of said voltage judgement circuit.

4. A sense amplifier circuit for use in a non-volatile memory with a plurality of memory cells connected to at least one bit line, comprising:
amplifier means comprising a load, a transistor connected between said load and said bit line, and an inverter connected between said bit line and a gate of said transistor, wherein said amplifier means senses data from said bit line; and
excess charge detecting means for detecting an excess charge of said amplifier means and for discharging the excess charge, said excess charge detecting means being responsive to a potential of said bit line and an output of said inverter.

5. The sense amplifier circuit according to claim 4, wherein said excess charge detecting means comprises a diode-connected transistor having a first terminal connected to the bit line and having a second terminal connected to the output of the inverter, said diode-connected transistor turning on when a voltage of said bit line exceeds a predetermined voltage, thereby decreasing the voltage of said bit line.

6. The sense amplifier circuit according to claim 4, wherein said excess charge detecting means comprises:
a first transistor having a gate connected to the output of the inverter and having a first terminal connected to a power source, for decreasing the output of said inverter by a first threshold voltage of the first transistor;
a diode-connected transistor having a first terminal connected to the bit line for increasing an output of said first transistor by a second threshold voltage, said diode-connected transistor turning on when a voltage of said bit line exceeds a predetermined voltage; and
a second transistor having a first terminal connected to a second terminal of said first transistor, a second terminal of said second transistor being connected to ground, a second terminal of said diode-connected transistor being connected to both the second terminal of the first transistor and the first terminal of the second transistor, wherein said second transistor discharges excess charge on said bit line.

7. The sense amplifier circuit according to claim 4, wherein said excess charge detecting means comprises:
a first n-channel transistor having a first terminal connected to a power source and having a gate connected the output of the inverter for decreasing the output of the inverter;
a second n-channel transistor having a diode connection and having a first terminal connected to a second terminal of the first n-channel transistor for decreasing an output voltage of the first n-channel transistor by a first threshold voltage; and
a p-channel transistor having a first terminal connected to the bit line and having a second terminal connected to ground for increasing a voltage of said bit line by a second threshold voltage, and for increasing an output of the second n-channel transistor by the second threshold voltage;
wherein excess charge on said bit line discharges through said p-channel transistor when the excess charge exceeds a predetermined value.

8. The sense amplifier circuit according to claim 1 wherein said excess charge discharging means comprises n-channel or p-channel MOS transistors connected between the bit line and ground.

9. A sense amplifier circuit for use in a non-volatile memory having a memory cell connected to a bit line and a word line, comprising:
sensing means for sensing a current flowing the in bit line in response to an operation state of the memory cell;
preventing means operatively coupled to said bit line for preventing a voltage of the bit line from exceeding a predetermined voltage, wherein said preventing means comprises:
means for decreasing a voltage obtained from said sensing means by a first predetermined value;
means for increasing the output of said decreasing means by a second predetermined value; and
means for discharging a current when the bit line voltage exceeds said predetermined voltage.

10. A sense amplifier circuit for use in a non-volatile memory having a memory cell connected to a bit line and a word line, comprising:
sensing means for sensing a current flowing the in bit line in response to an operation state of the memory cell;
preventing means operatively coupled to said bit line for preventing a voltage of the bit line from exceeding a predetermined voltage, wherein said preventing means comprises:
a first n-channel transistor for decreasing a voltage obtained from said sensing means by a first predetermined value;
a second n-channel transistor for decreasing an output value of said first n-channel transistor by a second predetermined value; and
a p-channel transistor for increasing an output of said second n-channel transistor by a third predetermined value.

11. A sense amplifier circuit for use in a non-volatile memory having a memory cell connected between a bit line and a word line, comprising:
load means having a first terminal connected to a power source;
a sensing transistor having a first terminal connected to a second terminal of said load, said sensing transistor having a second terminal connected to the bit line for sensing a current flowing through said memory cell;
inverter means connected to said bit line for inverting a bit line voltage to apply an inverted voltage to a gate of said sensing transistor means; and
a diode connected transistor having a drain connected to the bit line for preventing the bit line voltage from exceeding a predetermined value, said diode connected transistor turning on when the bit voltage is about to exceed the predetermined value.

* * * * *